United States Patent
Desai et al.

(10) Patent No.: US 11,640,193 B2
(45) Date of Patent: May 2, 2023

(54) DETECTING POWER DELIVERY NETWORK MARGINALITY IN A COMPUTING DEVICE

(71) Applicant: QUALCOMM INCORPORATED, San Diego, CA (US)

(72) Inventors: Kunal Desai, Bangalore (IN); Ankit Shambhu, Bangalore (IN); Srinivas Maddali, Bangalore (IN); Sanjeev Shukla, Bristol (GB)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/485,120

(22) Filed: Sep. 24, 2021

(65) Prior Publication Data

US 2023/0102986 A1    Mar. 30, 2023

(51) Int. Cl.
| | |
|---|---|
| G06F 1/28 | (2006.01) |
| G06F 11/30 | (2006.01) |
| G06F 1/26 | (2006.01) |
| G06F 1/04 | (2006.01) |
| G06F 11/22 | (2006.01) |
| G06F 1/30 | (2006.01) |

(52) U.S. Cl.
CPC .............. G06F 1/28 (2013.01); G06F 1/04 (2013.01); G06F 1/266 (2013.01); G06F 11/3058 (2013.01); G06F 1/30 (2013.01); G06F 1/305 (2013.01); G06F 11/22 (2013.01); G06F 11/2284 (2013.01)

(58) Field of Classification Search
CPC ... G06F 1/28; G06F 1/04; G06F 1/266; G06F 11/3058; G06F 1/30; G06F 11/22; G06F 1/305; G06F 11/2284
USPC .................................. 713/340; 714/22, 36
See application file for complete search history.

(56) References Cited

U.S. PATENT DOCUMENTS

| | | | |
|---|---|---|---|
| 10,009,016 B1 | 6/2018 | Ho et al. | |
| 2002/0100987 A1* | 8/2002 | Chang | H01L 23/49822 257/781 |
| 2008/0082887 A1* | 4/2008 | Dhong | G01R 31/318536 714/738 |
| 2012/0242490 A1* | 9/2012 | Ramaswami | G06F 1/28 340/663 |
| 2015/0026531 A1* | 1/2015 | Kosonocky | G01R 31/318575 714/726 |
| 2016/0285385 A1* | 9/2016 | Venerus | G01R 19/16547 |
| 2018/0183417 A1* | 6/2018 | Ho | G06F 1/10 |
| 2019/0339757 A1* | 11/2019 | Roy | G06F 1/26 |
| 2020/0174070 A1* | 6/2020 | Schat | G01R 31/31917 |
| 2020/0249276 A1* | 8/2020 | Pappu | G01R 31/31835 |

* cited by examiner

*Primary Examiner* — Ji H Bae
(74) *Attorney, Agent, or Firm* — Smith Tempel Blaha LLC/Qualcomm (57) ABSTRACT

A system-on-a-chip ("SoC") in a computing device may be provided with a power delivery network ("PDN") self-test to detect marginal PDN performance. In the self-test, a current surge may be generated on power supply connections of logic circuit blocks. Voltage monitors may measure voltage droop on the power supply connections responsive to the current surge. Voltage droop measurements may be compared with thresholds. An action, such as generation of an alert, may be performed if a voltage droop measurement exceeds a threshold.

20 Claims, 7 Drawing Sheets

DETECTING POWER DELIVERY NETWORK MARGINALITY IN A COMPUTING DEVICE

DESCRIPTION OF THE RELATED ART

A computing device may include multiple subsystems, cores or other components. Such a computing device may be, for example, a portable computing device ("PCD"), such as a laptop or palmtop computer, a cellular telephone or smartphone, portable digital assistant, portable game console, etc. Still other types of PCDs may be used in automotive and Internet-of-Things ("IoT") applications.

The multiple subsystems, cores or other components of a computing device may be included within the same integrated circuit chip or in different chips. A "system-on-a-chip" or "SoC" is an example of one such chip that integrates numerous components to provide system-level functionality. For example, an SoC may include one or more types of processors, such as central processing units ("CPU"s), graphics processing units ("GPU"s), digital signal processors ("DSP"s), and neural processing units ("NPU"s). An SoC may include other subsystems, such as a transceiver or "modem" subsystem that provides wireless connectivity, a memory subsystem, etc.

Computing devices and their components can experience failures while they are operating, possibly leading to undesirable outcomes. In some types of computing devices, such as safety-critical systems, an unexpected failure can lead to conditions dangerous to users or others. Although failures may have many causes, one such cause is related to degradation of components over time. For example, the effectiveness of power delivery network components, which are involved in delivering power to other components, may be reduced over time, leading to unpredictable performance of the computing device. A power delivery network experiencing marginal performance may fail under some use cases and not others. Some computing devices may perform self-tests of digital logic during boot-up or at other times, but such digital self-tests may be unable to predict failure caused by marginal performance of a power delivery network.

SUMMARY OF THE DISCLOSURE

Systems, methods, computer-readable media, and other examples are disclosed for testing a power delivery network ("PDN") in a system-on-a-chip ("SoC") of a computing device.

An exemplary system for testing a PDN in an SoC of a computing device may include current surge generator circuitry, a processor system, and at least one voltage monitor. The current surge generator circuitry may be configured to generate a current surge on a plurality of power supply connections of a plurality of logic circuit blocks. The voltage monitor may be configured to measure a voltage droop on one or more of the power supply connections responsive to the current surge. The processor system may be configured to receive a voltage droop measurement from a voltage monitor concurrently with generation of the current surge. The processor system may also be configured to compare the voltage droop measurement with a threshold. The processor system may further be configured to generate an alert when the voltage droop measurement exceeds the threshold.

An exemplary method for testing a PDN in an SoC of a computing device may include loading a register with a test vector. The method may also include generating a current surge on a plurality of power supply connections of a plurality of logic circuit blocks in response to a test vector loaded in the register. The method may further include measuring a voltage droop on one or more of the power supply connections responsive to the current surge. The method may include receiving a voltage droop measurement after loading the register with the test vector. The method may yet further include comparing the voltage droop measurement with a threshold. The method may still further include generating an alert when the voltage droop measurement exceeds the threshold.

Another exemplary system for testing a PDN in an SoC of a computing device may include means for loading a register with a test vector. The exemplary system may also include means for generating a current surge on a plurality of power supply connections of a plurality of logic circuit blocks in response to a test vector loaded in the register. The system may further include means for measuring a voltage droop on one or more of the power supply connections responsive to the current surge. The system may include means for receiving a voltage droop measurement after loading the register with the test vector. The system may yet further include means for comparing the voltage droop measurement with a threshold. The system may still further include means for generating an alert when the voltage droop measurement exceeds the threshold.

An exemplary computer-readable medium for testing a PDN in an SoC of a computing device may comprise a non-transitory computer-readable medium having instructions stored thereon in computer-executable form. The instructions, when executed by a processing system of the computing device, may configure the processing system to load a register with a test vector. The instructions may also configure the processing system to control generating a current surge on a plurality of power supply connections of a plurality of logic circuit blocks in response to a test vector loaded in the register. The instructions may further configure the processing system to control measuring a voltage droop on one or more of the power supply connections responsive to the current surge. The instructions may configure the processing system to receive a voltage droop measurement after loading the register with the test vector. The instructions may yet further configure the processing system to compare the voltage droop measurement with a threshold. The instructions may still further configure the processing system to generate an alert when the voltage droop measurement exceeds the threshold.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

The word "exemplary" is used herein to mean "serving as an example, instance, or illustration." The word "illustrative" may be used herein synonymously with "exemplary." Any aspect described herein as "exemplary" is not necessarily to be construed as preferred or advantageous over other aspects.

A safety-critical system, such as, for example, an automotive computing system, may run a built-in self-test or "BIST" before it begins operating. For example, an automobile's computing system may run a BIST when a driver starts up the automobile. If the results of the BIST indicate that the computing system may be subject to a failure of some type, measures may be taken to reduce the likelihood of a computing system failure endangering the vehicle occupants or others. For example, the driver may be alerted to the condition. In addition, the automobile may be disabled from being driven, or the automobile may be constrained to operate below a relatively low maximum speed. Operation of a system under such mitigation measures is commonly referred to as a "safe mode." Such a BIST may involve a self-test of aspects of the computing system's digital logic. However, a digital logic BIST is generally capable of detecting only "hard" or predictable failures, not marginal performance that may lead to less predictable failures while the system is being operated (e.g., vehicle is being driven).

The term power delivery network ("PDN") generally refers to the set of components, such as a board, chip, battery, package, connectors, circuit board traces, etc., involved in delivering power to other components of a computing device. Some PDN components may degrade or deteriorate over time due to the effects of aging, wear-and-tear, temperature variation, radiation, etc., leading to marginal performance. Unlike failures in digital logic, which are generally predictable, failures due to a deteriorating PDN component may be unpredictable and may not be detected by a digital logic BIST. That is, whether a failure occurs may depend upon demands placed upon the power being delivered to various components under various use cases or combinations of use cases.

Figure 1:
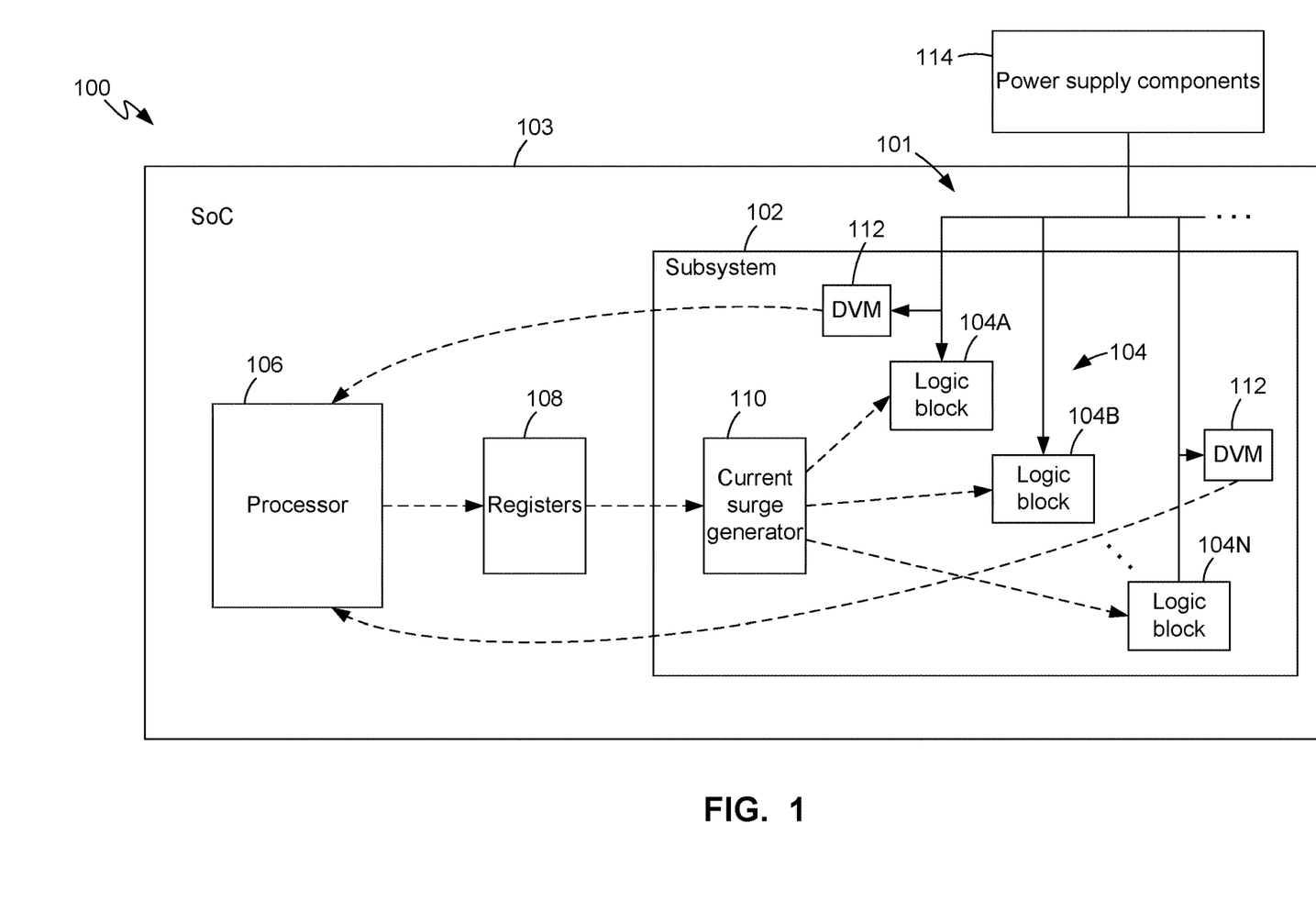
FIG. 1 is a block diagram illustrating a system for testing a power delivery network ("PDN") in a system-on-a-chip ("SoC") of a computing device, in accordance with exemplary embodiments.

In FIG. 1, an exemplary system 100 for self-testing a PDN 101 in a system-on-a-chip ("SoC") 103 is illustrated. Although not shown in FIG. 1 for purposes of clarity, the SoC 103 may be included in a computing system or device. The computing device may control aspects of, for example, a complex, safety-critical system, such as an autonomous or semi-autonomous vehicle. It may be desirable to detect conditions that may lead to failures in the computing device. In accordance with exemplary embodiments described herein, the PDN 101 may be tested in a manner that may detect marginal PDN performance.

The SoC 103 may include at least one subsystem 102. The subsystem 102 may broadly comprise any SoC subsystem, such as, for example, a CPU, GPU, NPU, DSP, modem, etc., or a core thereof. The subsystem 102 may include multiple logic circuit blocks 104, such as a first logic circuit block 104A, a second logic circuit block 104B, etc., through an Nth logic circuit block 104N. There may be, for example, on the order of tens, hundreds or even thousands of logic circuit blocks 104 in the subsystem 102 or other subsystems (not shown) of the SoC 103. The term "logic circuit block" is used herein to refer to a group of multiple, interconnected logic elements (e.g., gates, flip-flops, registers, multiplexers, etc.), configured to together perform one or more functions.

The PDN 101 may include power supply components 114 external to the SoC 103. The PDN 101 may also include a network of metal traces within the SoC 103 configured to distribute power from the power supply components 114 to the logic circuit blocks 104. Although not shown in FIG. 1 for purposes of clarity, the PDN 101 may include additional elements, such as, for example, switches. As described below, a self-test may be performed on portions of the PDN 101 within the SoC 103. Portions of the PDN 101 within the SoC 103 that feed or distribute power to the logic circuit blocks 104 may be referred to as power supply connections to the logic circuit blocks 104.

Although a digital logic BIST could be executed on the logic circuit blocks 104 (e.g., when the SoC 103 is booted, or at other times), such a logic test may not detect marginal or unpredictable performance resulting from degradation of the PDN over time. Some logic circuit blocks 104 may behave differently depending upon whether they are properly receiving power from the PDN 101. For example, under some use cases or combinations of use cases, the PDN 101 may be stressed by the current demands of the logic circuit blocks 104 to the point of producing a current spike or surge.

A current surge refers to a high rate of change in current (for example, over a few nanoseconds). Rate of change in current may be referred to as "di/dt" or the first derivative of current with respect to time. The current surge is generally related to capacitance in the logic circuit blocks 104 and portions of the PDN 101 feeding the logic circuit blocks 104. A current surge may result in a corresponding voltage droop on portions of the PDN 101 feeding one or more of the logic circuit blocks 104. Voltage droop that exceeds a threshold, such as, for example, five percent of the supply voltage ("VDD"), may prevent those logic circuit blocks 104 from operating properly while the voltage droop is occurring. Exemplary embodiments described herein are directed to testing portions of the PDN 101 to detect marginal PDN performance. The SoC 103 may perform such a self-test when, for example, it is booting up in preparation for participating in controlling a safety-critical system, such as, for example, a vehicle.

The SoC 103 may include a processor 106 configured to perform the above-referenced self-test of the PDN 101. The processor 106 may be configured to, based on the results of the self-test, issue an alert, apply mitigating measures (e.g., a fail-safe mode of operation), or take other action. Although the processor 106 in the illustrated embodiment is separate from the subsystem 102 for clarity of description, in other embodiments such a processor could be included in the subsystem 102 or other subsystem. The processor 106 may be any SoC processor. For example, the processor 106 may be a CPU (also referred to as an applications processor) on which various tasks may be executed. Alternatively, the processor 106 may be a separate processor that is provided in addition to the CPU and other SoC subsystem processors and dedicated to the self-testing described herein.

Broadly, performing the self-test may include the processor 106 loading one or more registers 108 with one or more test vectors. The outputs of the registers 108 are coupled to current surge generator circuitry 110, some or all of which may be in the subsystem 102. Other SoC subsystems (not shown) may similarly include other portions of such current surge generator circuitry. Accordingly, other SoC subsystems may be tested in the manner described herein with regard to the exemplary subsystem 102. The current surge generator circuitry 110 may be configured to respond to the test vectors in the registers 108 by producing a current surge on power supply connections to the logic circuit blocks 104.

The test vectors may be determined, for example, by the entity that designs or produces the SoC 103. For example, chip design and verification software tools may be used to analyze an electronic design model of the SoC 103 during the SoC design phase (before the SoC 103 is manufactured), sometimes also referred to as the "pre-silicon" phase. The design and verification software tools may enable test data to be input to the SoC model, and such test data may include the above-described test vectors. The design and verification software tools may include a power analysis software tool that, among other features, may capture current and voltage levels on various power supply rails under simulated SoC operating conditions. An example of such a power analysis tool is PRIMETIME PX from Synopsys of Mountain View, Calif. Other examples of power analysis tools are known to one of ordinary skill in the art.

The term "use case" refers to operation of the computing device toward a goal from the perspective of a user. Different use cases may correspond to execution of different software applications or other tasks on a processing system. The term "use case" includes combinations of concurrent use cases. For example, a use case may involve a CPU subsystem executing a navigation application while a communication subsystem is concurrently providing wireless connectivity for navigation. It is generally known by one of ordinary skill in the art under which uses cases the PDN 101 or portions thereof experience current surges (and thus voltage droop). One of ordinary skill in the art may determine a use case under which a portion of the PDN 101 experiences a current surge or voltage droop that reaches a threshold. The threshold may be a voltage below which one of ordinary skill in the art may be unable to predict proper operation of one or more of the logic circuit blocks 104. The threshold, in other words, represents a maximum voltage droop on a corresponding portion of the (non-degraded) PDN 101 that may realistically be expected under a use case.

When a use case under which a portion of the PDN 101 experiences a current surge or voltage droop of a magnitude that exceeds the aforementioned threshold is determined, a corresponding test vector may be determined that produces a similar effect (e.g., a target voltage droop). That is, a test vector (or combination of sequential test vectors) may be determined that, when loaded in the registers 108, causes the current surge generator circuitry 110 to produce a current surge or voltage droop of approximately the same magnitude as under that use case. Multiple test vectors may be determined in this manner for corresponding portions of the PDN, as described below. The test vectors may be stored in a location that will be accessible to the processor 106 (e.g., in non-volatile memory (not shown) on the SoC 103 or external to the SoC 103).

Dynamic voltage monitors ("DVM"s) 112 in the subsystem 102 may be configured to measure voltages (and thus voltage droop) on portions of the PDN 101, such as power supply connections that feed the various logic circuit blocks 104. The processor 106 may be configured to read voltage measurements produced by the DVMs 112, as conceptually indicated by the curved arrows.

Figure 2:
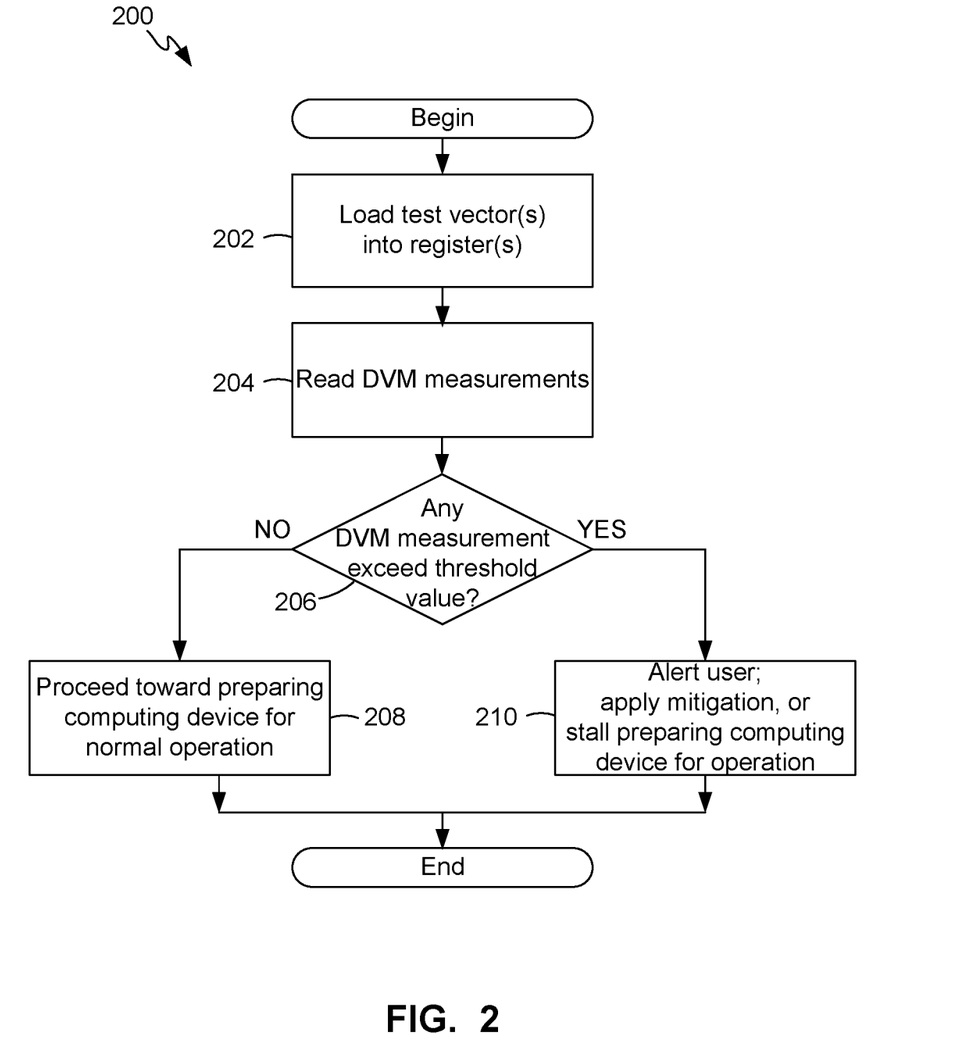
FIG. 2 is a flow diagram illustrating a method for testing a PDN in an SoC of a computing device, in accordance with exemplary embodiments.

In FIG. 2, a method 200 for testing an SoC PDN in a computing device to detect PDN degradation may include the following. Although the processor 106 may initiate the self-test at any time, in the exemplary method 200 the processor 106 may initiate the self-test during the process of booting the SoC 103. The SoC 103 may boot in preparation for participating in controlling a system, such as, for example, a vehicle or other safety-critical system. Alternatively, the processor 106 may initiate the self-test at other times, such as on a periodic basis during operation (e.g., of the vehicle). Such a built-in self-test or "BIST" may decrease the likelihood of a failure occurring unexpectedly while the vehicle is being operated.

As indicated by block 202, the processor 106 may load the one or more registers 108 (FIG. 1) with the one or more test vectors. Loading the one or more registers 108 may comprise loading multiple test vectors sequentially, shifting test vectors bitwise in the registers 108, or other actions that result in a change in the output of the registers 108. In a manner described further below, the change may cause the current generator circuitry 110 (FIG. 1) to produce a current surge (and thus a voltage droop).

As indicated by block 204, the processor 106 may then read voltage measurements produced by the DVMs 112. These voltage measurements may capture any voltage droop that occurs in response to the loading of the test vectors. The processor 106 may read voltage measurements produced by the various DVMs 112 in the subsystem 102 and any other such subsystems (not shown) of the SoC 103.

Figure 3:
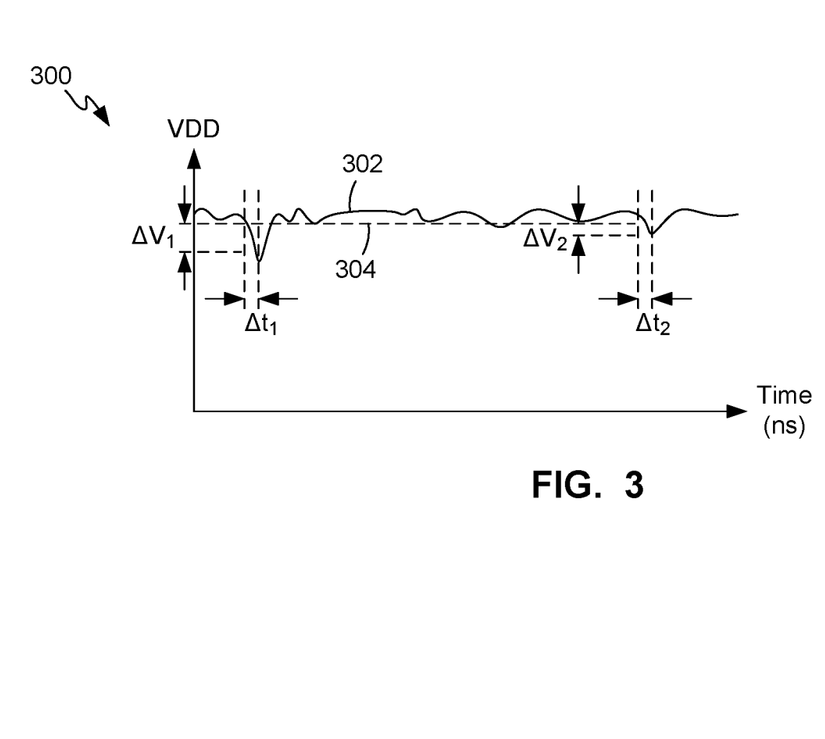
FIG. 3 is a plot illustrating measuring voltage droops, in accordance with exemplary embodiments.

Referring briefly to FIG. 3, a supply voltage plot 300 illustrates an example in which a measured supply voltage 302 exhibits a first voltage droop ("AV1") over a first time interval ("AU") and then later in time exhibits a second voltage droop ("AV2") over a second time interval ("At2"). Each time interval may be, for example, 5 nanoseconds. Voltage droop is the amount by which the supply voltage 302 is less than the nominal supply voltage level 304. The processor 106 may read voltage measurements from the DVMs 112 over a timespan following application of the test vectors, in order to capture any voltage droops that occur during that timespan. In the illustrated example, the processor 106 may capture the first and second voltage droops. In the illustrated example, the first voltage droop may exceed a threshold, while the second voltage droop may not exceed a threshold.

Returning to FIG. 2, as indicated by block 206, the processor 106 may compare the voltage droop measurements with one or more thresholds. In some examples of the method 200, there may be multiple thresholds. For example, there may be a threshold corresponding to each of the DVMs 112 and thus corresponding to that DVM's voltage droop measurements. In such an example, the processor 106 may compare the voltage droop measurement produced by each DVM 112 with the threshold corresponding to that DVM 112.

Figure 4:
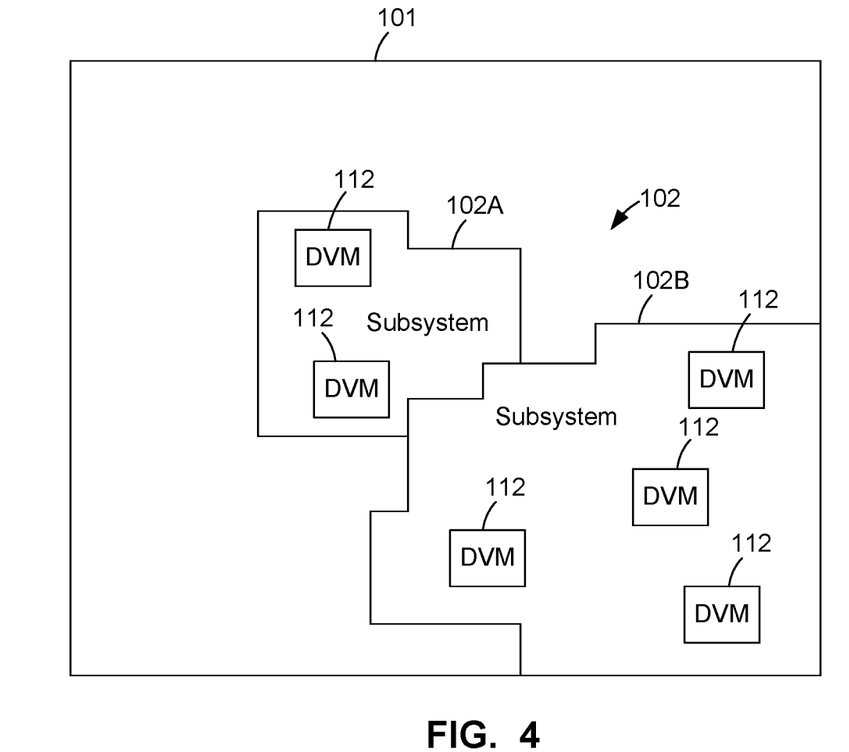
FIG. 4 is a conceptual plan view of an SoC having dynamic voltage monitors, in accordance with exemplary embodiments.

Referring briefly to FIG. 4, an exemplary physical or spatial layout of subsystems 102 on the SoC 103, such as a first subsystem 102A and a second subsystem 102B, is illustrated. The DVMs 112 are spatially distributed about each of the exemplary subsystem 102A and 102B. Each DVM 112 thus may be coupled to a different portion of the PDN (not shown in FIG. 4), such as to various branches of the PDN (e.g., circuit traces) supplying power to logic circuit elements (not shown in FIG. 4) in different spatial regions of the SoC 103.

Returning to FIG. 2, if the processor 106 determines (block 206) that no measured voltage droop exceeded a corresponding threshold, then the processor 106 may proceed with preparing the overall system that includes the processor 106 (e.g., a vehicle system) to operate in a normal or full operational mode, as indicated by block 208. That is, as the test results indicated that the PDN, when stressed with one or more current surges, has not degraded to an extent that may result in logic circuit failure, no action need be taken. For example, the processor 106 may boot the SoC 103 in a manner that results in the SoC 103 being ready to participate in controlling a vehicle.

However, if the processor 106 determines (block 206) that at least one measured voltage droop exceeded a corresponding threshold, then the processor 106 may stall the process of preparing the system that includes the processor 106 (e.g., a vehicle system) for normal or full operation. Alternatively, or in addition, one or more actions may be taken. The boot sequence may be stalled or interrupted to take action or, alternatively, action may be taken after the boot sequence is completed. Such actions may include generating an alert. The alert may be of any type and provided in any way. For example, generating an alert may include alerting an operator of the vehicle that there may be an increased risk in operating the vehicle. Third parties, such as a service provider, may be remotely alerted via wireless communications. The alert may include transmitting captured voltage measurement data to a remote party for analysis. In addition, or alternatively, the actions may include measures to mitigate the risk, such as placing the vehicle in a fail-safe operational mode. A fail-safe operational mode may be contrasted with the above-referenced (block 208) normal or full operational mode. For example, in a fail-safe mode, power may be provided preferentially to safety-related subsystems by throttling a power supply voltage (or a frequency, a display resolution, etc.) to non-safety-related vehicle features or subsystems, such as infotainment systems. In contrast, in the normal or full operational mode, both safety-related and non-safety-related subsystems may be fully operational. Alternatively, or in addition, a fail-safe mode may prevent the vehicle from being operated at a speed exceeding a threshold. In contrast, in the normal or full operational mode, the vehicle is not prevented from being operated at speeds exceeding that threshold. Still another alternative may be to prevent the vehicle from being operated altogether. Each DVM may have multiple thresholds used for comparison and there could be several such DVM distributed throughout the SoC. The actions taken in case of high droop may depend on the number of thresholds crossed on a given DVM, number of DVMs that see their thresholds crossed and specific locations of these DVMs on the SoC die.

Figure 5:
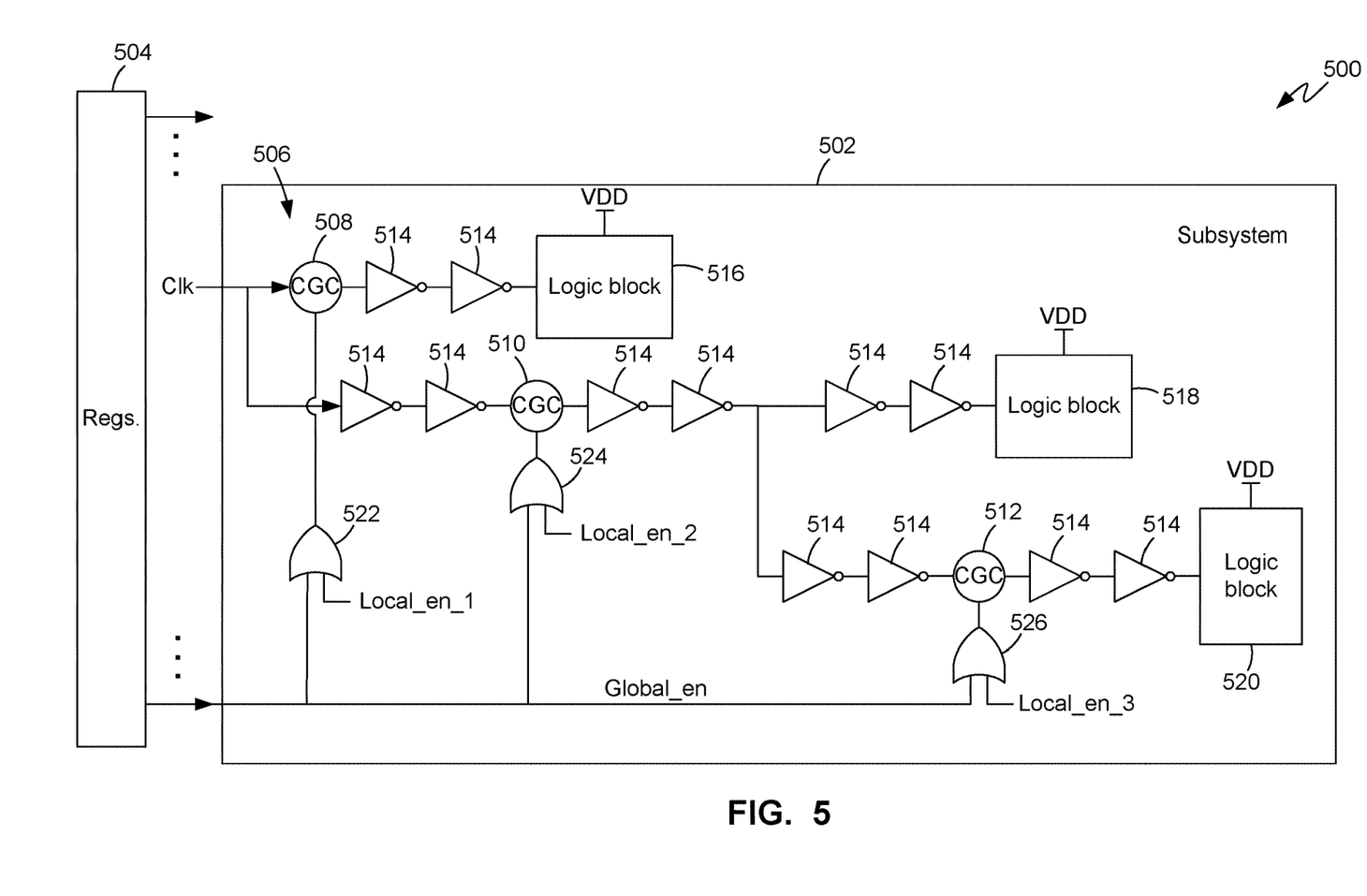
FIG. 5 is a block diagram of an SoC subsystem having current surge generator circuitry comprising clock gating circuitry, in accordance with exemplary embodiments.

In FIG. 5, an example is illustrated in which a subsystem 502 is coupled to the outputs of one or more registers 504. The subsystem 502 and registers 504 may be examples of the above-described subsystem 102 and registers 108 (FIG. 1), respectively. In the illustrated example, clock gating circuitry 506 serves as an example of the current surge generator circuitry 110 described above with regard to FIG. 1. The clock gating circuitry 506 may include clock gating cells ("CGC"s) 508, 510, 512, etc. Although three CGCs 508-512 are shown in the clock gating circuitry 506 as examples, the clock gating circuitry 506 may include any number (e.g., on the order of tens, hundreds, thousands, etc.) of CGCs or other clock signal control circuitry. The clock gating circuitry 506 may further include buffers in the form of, for example, series-coupled inverters 514. The buffers couple the outputs of the CGCs 508, 510 and 512 to clock signal inputs of logic circuit blocks 516, 518 and 520, respectively. Although three logic circuit blocks 516-520 are shown in the subsystem 502 as examples, the subsystem 502 may include any number (e.g., on the order of tens, hundreds, thousands, etc.) of logic circuit blocks. The logic circuit blocks 516-520 may be examples of the above-described logic circuit blocks 104 (FIG. 1).

Each of the CGCs 508-512 has three connections: a clock signal input, a gate or enable input, and a clock signal output. Providing a value of "1" at a CGC enable input enables the CGC to pass the clock signal through from its clock signal input to its clock signal output. Providing a value of "0" at a CGC enable input disables the CGC from passing the clock signal through from its clock signal input to its clock signal output.

In normal operation, i.e., when the subsystem 502 is not undergoing the self-test described herein, the CGCs 508, 510 and 512 may be controlled or enabled by local clock enable signals Local_en_1, Local_en_2 and Local_en_3, respectively, which are provided to the CGC enable inputs. These local clock enable signals may be provided by other circuitry (not shown) in the subsystem 502. In normal operation, the local clock enable signals are not asserted (e.g., transition from "0" to "1") simultaneously. Rather, for example, Local_en_1 may be asserted first, which enables the CGC 508 to pass a clock signal to the logic circuit block 516. Then, after the logic circuit block 516 has operated for some number of clock cycles, Local_en_2 may be asserted, which enables the CGC 510 to pass a clock signal to the logic circuit block 518. Then, after the logic circuit block 518 has operated for some number of clock cycles, Local_en_3 may be asserted, which enables the CGC 512 to pass a clock signal to the logic circuit block 520. It should be understood that the foregoing signal sequence is intended only as an example, illustrating the principle that all such local clock enable signals are not, in normal operation, asserted simultaneously, and thus that all the logic circuit blocks 516-520 do not, in normal operation, begin to be clocked simultaneously.

However, when the subsystem 502 undergoes the self-test described herein, a global clock enable signal, Global_en, may enable many (or all) of the CGCs 508-512 to simultaneously begin to pass clock signals to the logic circuit blocks 516-520, respectively. The OR gates 522, 524 and 526 provide either the local clock enable signals, when asserted, or the global clock enable signal, when asserted, to the CGCs 508-512. The global clock enable signal may be an output of the registers 504. Accordingly, when the registers 504 are loaded with a value that includes an asserted global clock enable signal (e.g., having a value of "1"), the logic circuit blocks 516-520 begin to be clocked essentially simultaneously. As the portions of the PDN feeding the logic circuit blocks 516-520 may include some parasitic or similar capacitance, the logic circuit blocks 516-520 may draw a surge of current when they begin to be clocked.

Portions of the PDN connecting the power supply rail (VDD) to one or more of the circuit blocks 516-520 may experience a current surge and therefore a voltage droop. As described above with regard to FIGS. 1 and 4, the DVMs 112 (not shown in FIG. 5) may measure any such voltage droop. The power supply connections on which the DVMs 112 may measure voltage droop include any portions of the PDN that deliver power to the circuit blocks 516-520.

The illustrated global clock enable signal Global_en that is provided to the subsystem 502 may be one of any number of such global clock enable signals. Other such global clock enable signals may be provided to other subsystems (not shown in FIG. 5).

To determine a test vector that produces a voltage droop of a target magnitude, an iterative search can be performed. A first candidate test vector that enables only a small number of CGCs in the illustrated subsystem 502 and other subsystems may be loaded into the registers 504. Voltage droop magnitude measurements responsive to the first candidate test vector may be obtained and compared with target voltage droops. If a measured voltage droop magnitude that is responsive to a candidate test vector is approximately equal to a target voltage droop, then that candidate test vector may be stored as described above for use during the self-test. If a measured voltage droop magnitude is less than a target voltage droop, then a next (e.g., second) candidate test vector that enables a greater number of CGCs may be loaded into the registers 504. Voltage droop measurements responsive to this next candidate test vector may be obtained and compared with the target voltage droop. The method may be repeated until a voltage droop measurement is found that is approximately equal to the target voltage droop.

Figure 6:
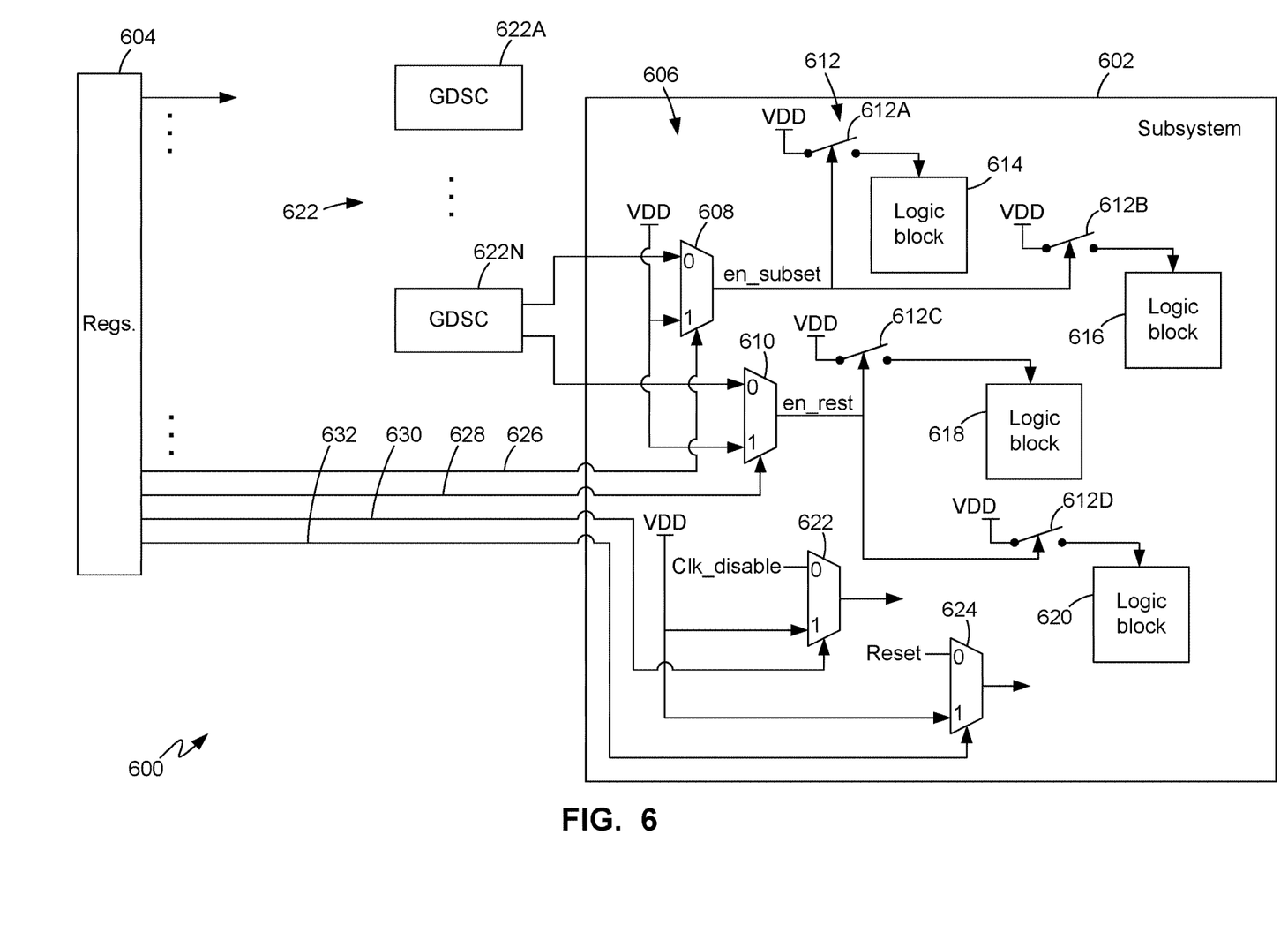
FIG. 6 is a block diagram of an SoC subsystem having current surge generator circuitry comprising power switching circuitry, in accordance with exemplary embodiments.

In FIG. 6, an example is illustrated in which a subsystem 602 is coupled to the outputs of one or more registers 604. The subsystem 602 and registers 604 may be examples of the above-described subsystem 102 and registers 108 (FIG. 1), respectively. In the illustrated example, power switching circuitry 606 serves as an example of the current surge generator circuitry 110 described above with regard to FIG. 1. The power switching circuitry 606 may include multiplexers ("MUX"es) 608, 610, etc. Although two MUXes 608 and 610 are shown in the power switching circuitry 606 as examples, the power switching circuitry 606 may include any number of MUXes or similar power switching circuitry. The power switching circuitry 606 may further include power switches 612, such as power switches 612A, 612B, 612C, 612D, etc. In the illustrated example, power switches 612A, 612B, 612C and 612D selectively couple a power supply rail (VDD) to supply voltage connections of the logic circuit blocks 614, 616, 618 and 620, respectively. Although four logic circuit blocks 614-620 are shown in the subsystem 602 as examples, the subsystem 602 may include any number of such logic circuit blocks. The logic circuit blocks 614-620 may be examples of the above-described logic circuit blocks 104 (FIG. 1).

The system 600 may include any number of power controllers or switch controllers, referred to herein as global distributed switch controllers ("GDSC"s) 622, such as GDSCs 622A-622N. In the illustrated example, an exemplary GDSC 622N may be coupled to the power switches 612 (via the MUXes 608 and 610). In normal operation, i.e., when the subsystem 602 is not undergoing the self-test described herein, the GDSC 622N may control or select which of the switches 612 are closed and thus couple the power supply rail to the supply voltage connections of logic circuit blocks 614-620. However, when the subsystem 602 undergoes the self-test described herein, the MUXes 608 and 610 may override this function of the GDSC 622N. For example, in normal operation the MUX 608 may select the one of its two inputs that is coupled to an output of the GDSC 622N. As a result, the GDSC 622N may, by controlling the power switches 612A and 612B, control whether the power supply rail is coupled to the supply voltage connections of logic circuit blocks 614 and 616, respectively. Similarly, in normal operation the MUX 610 may select the one of its two inputs that is coupled to another output of the GDSC 622N. As a result, the GDSC 622N may, by controlling the power switches 612C and 612D, control whether the power supply rail is coupled to the supply voltage connections of logic circuit blocks 618 and 620, respectively. Other GDSCs 622 may be similarly coupled to power switches of other subsystems (not shown).

Various output bits of the one or more registers 604 may be coupled to the control or selector inputs of the MUXes 608 and 610 as well as two other MUXes 622 and 624 in the illustrated example. For example, bits 626, 628, 630 and 632 may be coupled to the selector inputs of the MUXes 608, 610, 622 and 624, respectively. In normal operation, i.e., when the subsystem 602 is not undergoing the self-test described herein, the bits 626-632 loaded into the registers 604 may have "0" values, causing the MUXes 608 and 610 to respond as described above. However, when the subsystem 602 undergoes the self-test described herein, other values for the bits 626-632 may be loaded into the registers 604. For example, a value of "1" for the bit 626 may first be loaded, thereby causing the MUX 608 to select the other of its two inputs, which is coupled to a "1" voltage level (e.g., VDD), thereby overriding the output of the GDSC 622N. The MUX 608 provides the "1" value of its selected input to its output, which may be referred to in this example as "en_subset." The "en_subset" signal is coupled to the control inputs of the power switches 612A and 612B in the illustrated example. Thus, when the bit 626 has a value of "1," the power switches 612A and 612B may couple the supply rail to the supply voltage connections of logic circuit blocks 614 and 616, respectively. During this time, the value of "0" for the bit 628 may continue to result in the power switches 612C and 612D not coupling the power supply rail to the supply voltage connections of logic circuit blocks 618 and 620, respectively. Thus, in this initial state of the self-test, the logic circuit blocks 614 and 616 are powered or coupled to the supply rail, while the logic circuit blocks 618 and 620 are unpowered or not coupled to the supply rail.

Then, in a next state of the self-test, a value of "1" for the bit 628 may be loaded, thereby causing the MUX 610 to select the other of its two inputs, which is coupled to a "1" voltage level (e.g., VDD). The MUX 610 provides the "1" value of its selected input to its output, which may be referred to in this example as "en_rest." The "en_rest" signal is coupled to the control inputs of the other power switches 612C and 612D (i.e., the rest of the power switches 612 in this example). Thus, when a first test vector, in which the bits 626 and 628 have values of "1" and "0," respectively, is loaded into the registers 604, the power switches 612A and 612B couple the supply rail to only a subset of all logic circuit blocks 614-620, namely, only the logic circuit blocks 614 and 616. However, when a second test vector, in which the bit 628 has a value of "1," is subsequently loaded into the registers 604, the power switches 612C and 612D couple the supply rail to the remainder or rest of the logic circuit blocks 618 and 620. That is, when a second test vector, in which the bits 626 and 628 both have values of "1," is subsequently loaded into the registers 604, the power switches 612 together couple the supply rail to all of the logic circuit blocks 614-620.

When only the subset of logic circuit blocks 614-620 are powered in this example, they draw a smaller amount of current than when all of the logic circuit blocks 614-620 are powered. Transitioning from loading a first test vector that causes only the subset of logic circuit blocks 614-620 to be powered to loading a second test vector that causes all of the logic circuit blocks 614-620 to be powered may generate a current surge and thus a voltage droop. Although in the illustrated example there are four logic blocks 614-620, there could be a much greater number, resulting in a substantial current surge. Through the MUX 608, a percentage of such logic blocks, such as, for example, 25 percent of the logic blocks, could first be enabled, and through the MUX 608 the remainder of such logic blocks, such as a remaining 75 percent, could subsequently be enabled, to generate the current surge and thus the voltage droop.

The power switching circuitry 606 may further include one or more clock disable MUXes 622 and one or more reset signal MUXes 624. Although only two such MUXes 622 and 624 are shown for purposes of clarity, there may be a number of clock disable MUXes 622 and reset signal MUXes 624 corresponding to the number (e.g., four in the illustrated example) of logic circuit blocks 614-620. The output of each MUX 622 may be coupled to clock signal control circuitry (not shown) that selectively enables and disables one or more clock signals on which the corresponding one of the logic circuit block 614-620 operates. Similarly, the output of each MUX 624 may be coupled to reset signal control circuitry (not shown) that resets the corresponding one of the logic circuit blocks 614-620.

Before powering-off the logic circuit blocks 614-620 in the manner described above, the clock signals on which the logic circuit blocks operate may be disabled through the MUX 624. When the bit 630 that is coupled to the selector input of the MUX 622 has a "0" value, the MUX 622 may provide a clock disable ("Clk_disable") signal to the corresponding one of the logic circuit blocks 614-620. The Clk_disable signal may be generated by other SoC circuitry (not shown). In normal operation, i.e., when the subsystem 602 is not undergoing the self-test described herein, the Clk_disable signal may control the MUX 622 to selectively provide (via the clock signal control circuitry (not shown)) the corresponding one of the logic circuit blocks 614-620 with the one or more clock signals needed for normal operation. Before powering-on one of the logic circuit block 614-620 in the manner described above, the bit 630 may be switched to a "1" value, causing the MUX 622 to provide a "1" value (e.g., VDD) to the clock signal control circuitry of the corresponding one of the logic circuit blocks 614-620. Enabling the clock signals in this manner enables the logic circuit blocks 614-620 to participate in the self-test as described above.

Similarly, when the bit 632 that is coupled to the selector input of the MUX 624 has a "0" value, the MUX 624 may provide a "Reset" signal to the corresponding one of the logic circuit blocks 614-620. The Reset signal may be generated by other SoC circuitry (not shown) that controls resetting of the logic circuit blocks 614-620 in normal operation. To place the logic circuit blocks 614-620 in a known or reset state before beginning the self-test, the logic circuit blocks 614-620 may be reset through the one or more MUXes 624. Before powering-on one of the logic circuit block 614-620 in the manner described above, the bit 632 may be switched to a "1" value, causing the MUX 624 to provide a "1" value (e.g., VDD) to the reset signal control circuitry (not shown) that resets the corresponding one of the logic circuit blocks 614-620.

The power supply (VDD) connections of one or more of the circuit blocks 612 may experience a current surge and thus a voltage droop. As described above with regard to FIGS. 1 and 4, DVMs 112 (not shown in FIG. 6) may measure such voltage droop. The power supply connections on which the DVMs 112 may measure voltage droop include any portions of the PDN that deliver power to the circuit blocks 612.

Figure 7:
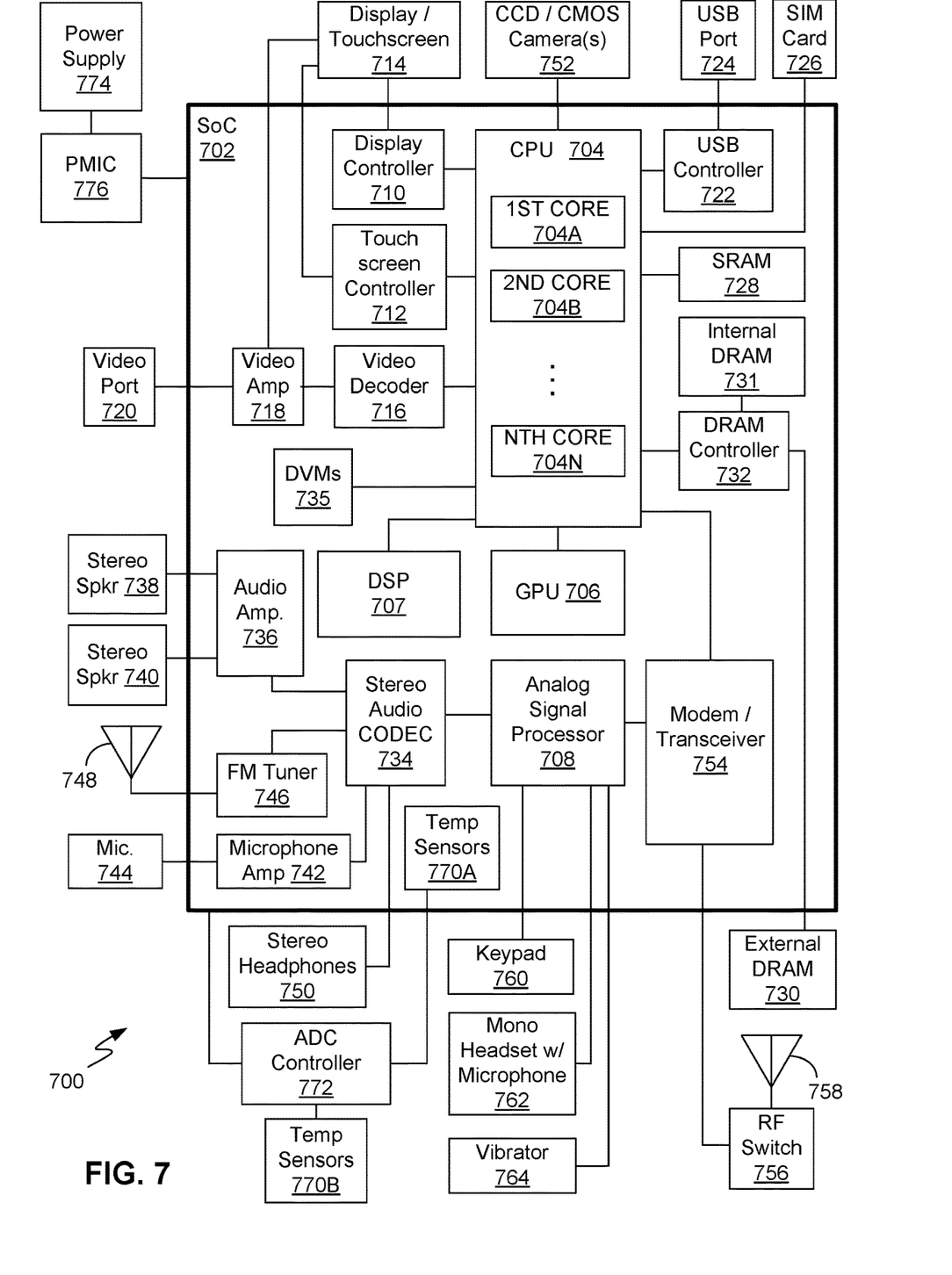
FIG. 7 is block diagram of a computing device, in accordance with exemplary embodiments.

FIG. 7 illustrates an example of a PCD 700, such as a mobile phone, in which exemplary embodiments of systems, methods, computer-readable media, and other examples of self-testing a PDN may be provided. For purposes of clarity, some data registers, interconnects, clock signals, etc., are not shown in FIG. 7. Although the PCD 700 is shown as an example, other embodiments of systems, methods, computer-readable media, and other examples of self-testing a PDN may be provided in other types of computing devices or systems. An example of such a system may be a safety-critical system. An example of a safety-critical system may be an automotive vehicle, such as an autonomous or semi-autonomous vehicle. Nevertheless, still other examples of self-testing a PDN may be provided in datacenter, Internet-of-Things ("IoT"), and other contexts.

The PCD 700 may include an SoC 702. The SoC 702 may include a CPU 704, an NPU 705, a GPU 706, a DSP 707, an analog signal processor 708, a modem/modem subsystem 754, or other processors. The CPU 704 may include one or more CPU cores, such as a first CPU core 704A, a second CPU core 704B, etc., through an Nth CPU core 704N. The SoC 702 may be an example of the SoC 103 described above with regard to FIG. 1. The foregoing subsystems, such as the CPU 704, NPU 705, GPU 706, DSP 707, analog signal processor 708, and modem subsystem 754, may be examples of any of the above-described subsystems 102 (FIGS. 1 and 4), 502 (FIG. 5), 602 (FIG. 6), etc.

A display controller 710 and a touch-screen controller 712 may be coupled to the CPU 704. A touchscreen display 714 external to the SoC 702 may be coupled to the display controller 710 and the touch-screen controller 712. The PCD 700 may further include a video decoder 716 coupled to the CPU 704. A video amplifier 718 may be coupled to the video decoder 716 and the touchscreen display 714. A video port 720 may be coupled to the video amplifier 718. A universal serial bus ("USB") controller 722 may also be coupled to CPU 704, and a USB port 724 may be coupled to the USB controller 722. A subscriber identity module ("SIM") card 726 may also be coupled to the CPU 704.

One or more memories may be coupled to the CPU 704. The one or more memories may include both volatile and non-volatile memories. Examples of volatile memories include static random access memory ("SRAM") 728 and dynamic random access memory ("DRAM") 730 and 731. Such memories may be external to the SoC 702, such as the DRAM 730, or internal to the SoC 702, such as the DRAM 731. A DRAM controller 732 coupled to the CPU 704 may control the writing of data to, and reading of data from, the DRAMs 730 and 731.

Multiple DVMs 735 (only one of which is shown for purposes of clarity) may be spatially distributed about the SoC 702 and coupled to spatially distributed portions of the PDN as described above with regard to FIG. 4. Although FIG. 7, being a block diagram, is not intended to indicate physical locations, it should be understood that the DVMs 735 may be physically located within various subsystems. For example, DVMs 735 may be located within any or all of the CPU 704, NPU 705, GPU 706, DSP 707, analog signal processor 708, modem subsystem 754, etc.

A stereo audio CODEC 734 may be coupled to the analog signal processor 708. Further, an audio amplifier 736 may be coupled to the stereo audio CODEC 734. First and second stereo speakers 738 and 740, respectively, may be coupled to the audio amplifier 736. In addition, a microphone amplifier 742 may be coupled to the stereo audio CODEC 734, and a microphone 744 may be coupled to the microphone amplifier 742. A frequency modulation ("FM") radio tuner 746 may be coupled to the stereo audio CODEC 734. An FM antenna 748 may be coupled to the FM radio tuner 746. Further, stereo headphones 750 may be coupled to the stereo audio CODEC 734. Other devices that may be coupled to the CPU 704 include one or more digital (e.g., CCD or CMOS) cameras 752.

A modem or RF transceiver 754 may be coupled to the analog signal processor 708 and the CPU 704. An RF switch 756 may be coupled to the RF transceiver 754 and an RF antenna 758. In addition, a keypad 760, a mono headset with a microphone 762, and a vibrator device 764 may be coupled to the analog signal processor 708.

The SoC 702 may have one or more internal or on-chip thermal sensors 770A and may be coupled to one or more external or off-chip thermal sensors 770B. An analog-to-digital converter controller 772 may convert voltage drops produced by the thermal sensors 770A and 770B to digital signals.

A power supply 774 and a PMIC 776 may supply power to the PDN (not shown) of the SoC 702. The power supply 774 and the PMIC 776 may be examples of the power supply components 114 described above with regard to FIG. 1.

Firmware or software may be stored in any of the above-described memories, such as DRAM 730 or 731, SRAM 728, etc., or may be stored in a local memory directly accessible by the processor hardware on which the software or firmware executes. Execution of such firmware or software may control aspects of any of the above-described methods or configure aspects any of the above-described systems. Any such memory or other non-transitory storage medium having firmware or software stored therein in computer-readable form for execution by processor hardware may be an example of a "computer-readable medium," as the term is understood in the patent lexicon.

Implementation examples are described in the following numbered clauses:

1. A system for testing a power delivery network in a system-on-a-chip (SoC) of a computing device, comprising:
current surge generator circuitry configured to generate a current surge on a plurality of power supply connections of a plurality of logic circuit blocks;
at least one voltage monitor configured to measure a voltage droop on one or more of the power supply connections responsive to the current surge; and
a processor system configured to:
receive a voltage droop measurement from the at least one voltage monitor concurrently with generation of the current surge;
compare the voltage droop measurement with a threshold; and
generate an alert when the voltage droop measurement exceeds the threshold.

2. The system of clause 1, wherein the threshold is associated with a predetermined use case droop.

3. The system of clause 1 or 2, wherein a plurality of voltage monitors are spatially distributed on the SoC, each voltage monitor is configured to measure a corresponding voltage droop, and the processor system is configured to compare a plurality of voltage droop measurements measured by the plurality of voltage monitors with a corresponding plurality of thresholds.

4. The system of any of clauses 1-3, further comprising a register, wherein the current surge generator circuitry is coupled to the register and configured to generate a current surge on a plurality of power supply connections of a plurality of logic circuit blocks in response to a test vector loaded in the register.

5. The system of any of clauses 1-4, wherein the processor system is configured to load the register with the test vector, receive the voltage droop measurement, compare the voltage droop measurement, and generate an alert during booting of the SoC.

6. The system of any of clauses 1-5, wherein the current surge generator circuitry comprises clock gating circuitry configured to switch on clock signals simultaneously to the plurality of logic circuit blocks.

7. The system of any of clauses 1-6, wherein the current surge generator circuitry comprises power switching circuitry configured to switch on a plurality of power supply signals on the plurality of power supply connections.

8. The system of clause 7, wherein the power switching circuitry is configured to first switch on a subset of the plurality of power supply signals on a subset of the plurality of power supply connections and subsequently switch on the power supply signals on all of the plurality of power supply connections.

9. The system of any of clauses 1-8, wherein the SoC is included in a safety-critical system.

10. The system of clause 9, wherein the safety-critical system is a vehicle, and booting of the SoC occurs in preparation for operation of the vehicle.

11. The system of clause 10, wherein the processor system is further configured to switch vehicle operation to a fail-safe mode.

12. A method for testing a power delivery network in a system-on-a-chip (SoC) of a computing device, comprising:
loading a register with a test vector;
generating a current surge on a plurality of power supply connections of a plurality of logic circuit blocks in response to a test vector loaded in the register;
measuring a voltage droop on one or more of a plurality of power supply connections responsive to the current surge; and
receiving a voltage droop measurement after loading the register with the test vector;
comparing the voltage droop measurement with a threshold; and
generating an alert when the voltage droop measurement exceeds the threshold.

13. The method of clause 12, wherein the threshold is associated with a predetermined use case droop.

14. The system of clause 12 or 13, wherein a plurality of voltage monitors are spatially distributed on the SoC, each voltage monitor is configured to measure a corresponding voltage droop, and the processor system is configured to compare a plurality of voltage droop measurements measured by the plurality of voltage monitors with a corresponding plurality of thresholds.

15. The method of any of clauses 12-14, wherein generating a current surge comprises switching on clock signals simultaneously to the plurality of logic circuit blocks.

16. The method of any of clauses 12-15, wherein generating a current surge comprises switching on a plurality of power supply signals on the plurality of power supply connections.

17. The method of clause 16, wherein switching on a plurality of power supply signals comprises first switching on a subset of the plurality of power supply signals on a subset of the plurality of power supply connections and subsequently switching on the power supply signals on all of the plurality of power supply connections.

18. The method of any of clauses 12-17, wherein the SoC is included in a safety-critical system.

19. The method of clause 18, wherein loading the register, receiving the voltage droop measurement, comparing the voltage droop measurement, and generating an alert are performed during booting of the SoC.

20. The method of clause 19, wherein the safety-critical system is a vehicle, and booting of the SoC occurs in preparation for operation of the vehicle.

21. The method of clause 20, wherein the alert is directed to an operator of the vehicle.

22. The method of clause 21, further comprising switching vehicle operation to a fail-safe mode.

23. A system for testing a power delivery network in a system-on-a-chip (SoC) of a computing device, comprising:
    means for loading a register with a test vector;
    means for generating a current surge on a plurality of power supply connections of a plurality of logic circuit blocks in response to a test vector loaded in the register;
    means for measuring a voltage droop on one or more of a plurality of power supply connections responsive to the current surge; and
    means for receiving a voltage droop measurement after loading the register with the test vector;
    means for comparing the voltage droop measurement with a threshold; and
    means for generating an alert when the voltage droop measurement exceeds the threshold.

24. The system of clause 23, wherein the threshold is associated with a predetermined use case droop.

25. The system of clause 23 or 24, wherein the means for generating a current surge comprises means for switching on clock signals simultaneously to the plurality of logic circuit blocks.

26. The system of clause 23 or 24, wherein the means for generating a current surge comprises means for switching on a plurality of power supply signals on the plurality of power supply connections.

27. The system of any of clauses 23-26, wherein the SoC is included in a safety-critical system, and wherein the means for loading, the means generating, means for measuring, means for receiving, means for comparing, and means for generating are active during booting of the SoC.

28. The system of clause 27, wherein the SoC is included in a vehicle, and booting of the SoC occurs in preparation for operation of the vehicle.

29. A computer-readable medium for testing a power delivery network in a system-on-a-chip (SoC) of a computing device, the computer-readable medium comprising a non-transitory computer-readable medium having instructions stored thereon in computer-executable form, the instructions when executed by a processing system of the computing device configuring the processing system to control:
    loading a register with a test vector;
    generating a current surge on a plurality of power supply connections of a plurality of logic circuit blocks in response to a test vector loaded in the register;
    measuring a voltage droop on one or more of a plurality of power supply connections responsive to the current surge; and
    receiving a voltage droop measurement after loading the register with the test vector;
    comparing the voltage droop measurement with a threshold; and
    generating an alert when the voltage droop measurement exceeds the threshold.

30. The computer-readable medium of clause 29, wherein the threshold is associated with a predetermined use case droop.

31. The computer-readable medium of clause 29 or 30, wherein the instructions configuring the processing system to control generating a current surge comprise instructions configuring the processing system to control switching on clock signals simultaneously to the plurality of logic circuit blocks.

32. The computer-readable medium of clause 29 or 30, the instructions configuring the processing system to control generating a current surge comprise instructions configuring the processing system to control switching on a plurality of power supply signals on the plurality of power supply connections.

Alternative embodiments will become apparent to one of ordinary skill in the art to which the invention pertains. Therefore, although selected aspects have been illustrated and described in detail, it will be understood that various substitutions and alterations may be made therein.

What is claimed is:

1. A system for testing a power delivery network in a system-on-a-chip (SoC) of a computing device, comprising:
    current surge generator circuitry configured to generate a current surge on a plurality of power supply connections of a plurality of logic circuit blocks, the current surge generator circuitry comprising clock gating circuitry configured to switch on clock signals simultaneously to the plurality of logic circuit blocks to create the current surge, the clock gating circuitry being coupled to the plurality of logic circuit blocks, the clock gating circuitry switching on the clock signals simultaneously in response to receiving a global clock enable signal controlled by a register;
    at least one voltage monitor configured to measure a voltage droop on one or more of the power supply connections responsive to the current surge; and
    a processor system configured to:
        receive a voltage droop measurement from the at least one voltage monitor concurrently with generation of the current surge;
        compare the voltage droop measurement with a threshold; and
        generate an alert when the voltage droop measurement exceeds the threshold.

2. The system of claim 1, wherein the threshold is associated with a predetermined use case droop.

3. The system of claim 2, wherein a plurality of voltage monitors are spatially distributed on the SoC, each voltage monitor is configured to measure a corresponding voltage droop, and the processor system is configured to compare a plurality of voltage droop measurements measured by the plurality of voltage monitors with a corresponding plurality of thresholds.

4. The system of claim 1, wherein the register is loaded with a test vector.

5. The system of claim 4, wherein the processor system is configured to load the register with the test vector, receive the voltage droop measurement, compare the voltage droop measurement, and generate the alert during booting of the SoC.

6. The system of claim 1, wherein the SoC is included in a safety-critical system.

7. The system of claim 6, wherein the safety-critical system is a vehicle, and booting of the SoC occurs in preparation for operation of the vehicle.

8. The system of claim 7, wherein the processor system is further configured to switch vehicle operation to a fail-safe mode.

9. A method for testing a power delivery network in a system-on-a-chip (SoC) of a computing device, comprising:
coupling clock gating circuitry to a plurality of logic circuit blocks;
loading a register with a test vector;
generating a current surge by the clock gating circuitry switching on clock signals simultaneously to the plurality of logic circuit blocks in response to a global clock enable signal that is controlled by the register;
generating the global clock enable signal in response to receiving the test vector loaded in the register;
measuring a voltage droop on one or more of a plurality of power supply connections of the plurality of logic circuit blocks that are responsive to the current surge;
receiving a voltage droop measurement after the current surge;
comparing the voltage droop measurement with a threshold; and
generating an alert when the voltage droop measurement exceeds the threshold.

10. The method of claim 9, wherein the threshold is associated with a predetermined use case droop.

11. The method of claim 10, wherein a plurality of voltage monitors are spatially distributed on the SoC, each voltage monitor is configured to measure a corresponding voltage droop, and the method further comprises comparing a plurality of voltage droop measurements measured by the plurality of voltage monitors with a corresponding plurality of thresholds.

12. The method of claim 9, wherein the SoC is included in a safety-critical system.

13. The method of claim 12, wherein loading the register, receiving the voltage droop measurement, comparing the voltage droop measurement, and generating the alert are performed during booting of the SoC.

14. The method of claim 13, wherein the safety-critical system is a vehicle, and booting of the SoC occurs in preparation for operation of the vehicle.

15. The method of claim 14, wherein the alert is directed to an operator of the vehicle.

16. The method of claim 15, further comprising switching vehicle operation to a fail-safe mode.

17. A non-transitory computer-readable medium for testing a power delivery network in a system-on-a-chip (SoC) of a computing device, the SoC having clock gating circuitry coupled to a plurality of logic circuit blocks, the non-transitory computer-readable medium having instructions stored thereon in computer-executable form, the instructions when executed by a processing system of the computing device configuring the processing system to control:
loading a register with a test vector;
generating a current surge by the clock gating circuitry switching on clock signals simultaneously to the plurality of logic circuit blocks in response to a global clock enable signal that is controlled by the register;
generating the global clock enable signal in response to receiving the test vector loaded in the register;
measuring a voltage droop on one or more of a plurality of power supply connections of the plurality of logic circuit blocks that are responsive to the current surge;
receiving a voltage droop measurement after the current surge;
comparing the voltage droop measurement with a threshold; and
generating an alert when the voltage droop measurement exceeds the threshold.

18. The non-transitory computer-readable medium of claim 17, wherein the threshold is associated with a predetermined use case droop.

19. The non-transitory computer-readable medium of claim 17, wherein loading the register, receiving the voltage droop measurement, comparing the voltage droop measurement, and generating the alert are performed during booting of the SoC.

20. The non-transitory computer-readable medium of claim 17, wherein the SoC is included in a safety-critical system.

* * * * *